US012662612B2

(12) United States Patent
Furuta et al.

(10) Patent No.: US 12,662,612 B2
(45) Date of Patent: Jun. 23, 2026

(54) METHOD FOR FILTERING POLISHING ADDITIVE-CONTAINING LIQUID, POLISHING ADDITIVE-CONTAINING LIQUID, POLISHING COMPOSITION, METHOD FOR PRODUCING POLISHING COMPOSITION, AND FILTER

(71) Applicant: FUJIMI INCORPORATED, Kiyosu (JP)

(72) Inventors: Shinji Furuta, Kiyosu (JP); Takashi Hayakawa, Kiyosu (JP); Keiji Ashitaka, Kiyosu (JP); Naoya Miwa, Kiyosu (JP); Kohsuke Tsuchiya, Kiyosu (JP); Hisanori Tansho, Kiyosu (JP); Reiko Akizuki, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 1099 days.

(21) Appl. No.: 17/632,843

(22) PCT Filed: Jul. 30, 2020

(86) PCT No.: PCT/JP2020/029203
§ 371 (c)(1),
(2) Date: Feb. 4, 2022

(87) PCT Pub. No.: WO2021/024899
PCT Pub. Date: Feb. 11, 2021

(65) Prior Publication Data
US 2022/0267644 A1 Aug. 25, 2022

(30) Foreign Application Priority Data
Aug. 8, 2019 (JP) ................................. 2019-146778

(51) Int. Cl.
C09G 1/02 (2006.01)
B01D 69/02 (2006.01)
B01J 20/28 (2006.01)
B24B 7/22 (2006.01)
H10P 52/40 (2026.01)

(52) U.S. Cl.
CPC ............... *C09G 1/02* (2013.01); *B01D 69/02* (2013.01); *B01J 20/28085* (2013.01); *B01D 2325/02* (2013.01); *B24B 7/228* (2013.01); *H10P 52/402* (2026.01)

(58) Field of Classification Search
CPC ...... C09G 1/02; B01D 2325/02; B24B 7/228; H01L 21/30625
See application file for complete search history.

(56) References Cited

U.S. PATENT DOCUMENTS

| | | | | | |
|---|---|---|---|---|---|
| 6,146,747 | A | * | 11/2000 | Wang | B01D 69/02 427/244 |
| 2010/0190413 | A1 | * | 7/2010 | Nishimoto | B24B 37/044 451/28 |
| 2013/0134107 | A1 | | 5/2013 | Morinaga et al. | |
| 2013/0264277 | A1 | | 10/2013 | Heidenreich et al. | |
| 2015/0053627 | A1 | | 2/2015 | Silin et al. | |
| 2015/0376464 | A1 | | 12/2015 | Tsuchiya et al. | |
| 2016/0215189 | A1 | * | 7/2016 | Tsuchiya | C09G 1/04 |
| 2020/0185215 | A1 | | 6/2020 | Tanimoto et al. | |

FOREIGN PATENT DOCUMENTS

| | | | |
|---|---|---|---|
| CN | 1623627 | A | 6/2005 |
| CN | 102834156 | A | 12/2012 |
| CN | 104995277 | A | 10/2015 |
| CN | 105593418 | A | 5/2016 |
| JP | H11-302633 | A | 11/1999 |
| JP | 2012-044056 | A | 3/2012 |
| JP | 2014-173013 | A | 9/2014 |
| JP | 2015-045114 | A | 3/2015 |
| JP | 2016-089297 | A | 5/2016 |
| JP | 2017-075316 | A | 4/2017 |
| KR | 20130006604 | A | 1/2013 |
| KR | 20150119062 | A | 10/2015 |
| TW | I516305 | B | 1/2016 |

(Continued)

OTHER PUBLICATIONS

International Preliminary Report on Patentability of PCT Application No. PCT/JP2020/029203 dated Feb. 17, 2022.
CN Office Action for CN Appl. Ser. No. 202080056293.9 mail date Oct. 24, 2023 (15 pages).
JP Office Action for Japanese Patent Application No. 2019-146778 mail date Jun. 1, 2023 (6 pages).
EP Supplementary Search Report for Appl. Ser. No. EP 20 84 9840 (10 pages).
CN Second Office Action on CN Appl. Ser. No. 202080056293.9 Dated Jun. 26, 2024 (14 pages).
Office Action dated Apr. 23, 2024 in connection with the corresponding Taiwanese application No. 109126636.

(Continued)

*Primary Examiner* — Jane L Stanley
(74) *Attorney, Agent, or Firm* — Foley & Lardner LLP

(57) ABSTRACT

Provided is a method for filtering an additive-containing liquid that can achieve a polishing composition exhibiting excellent defect reducing capability while maintaining a practical filter life. The method for filtering a polishing additive-containing liquid provided by the present invention includes the step of: filtering the polishing additive-containing liquid with a filter that satisfies the following conditions (1) and (2). (1) The average pore diameter P measured by a palm porometer is 0.15 $\mu$m or less. (2) The pore diameter gradient ($S_{in}/S_{out}$), which is the ratio of the inlet-side average pore diameter ($S_{in}$) to the outlet-side average pore diameter ($S_{out}$), both diameters being measured through observation with an SEM, is 3 or less.

14 Claims, No Drawings

(56) References Cited

FOREIGN PATENT DOCUMENTS

| TW | 201912302 A | 4/2019 |
| WO | WO-2011/108418 A1 | 9/2011 |

OTHER PUBLICATIONS

KR First Office Action issued in corresponding Korean Application No. 10-2022-7007207 Dated Apr. 2, 2025 (15 pages).
CN Decision of Rejection issued in Corresponding CN Appl. Ser. No. 202080056293.9 Dated Dec. 16, 2024 (19 pages).
Qian Yingwei, "Design and Practice of Pharmaceutical Water System," Chemical Industry Press, Beijing, Jun. 2001 IBSN 7-5025-3296-X (6 pages).
CN Third Office Action issued in corresponding Chinese Application No. 202080056293.9 Dated Aug. 6, 2025 (20 pages).
Ye Yingqui et al., "Industrial Water Treatment Technology," 2004, Second Edition (4 Pages).
Written Decision on Registration on Korean Appl. No. 10-2022-7007207, dated Dec. 1, 2025 (8 pages, with English translation).

* cited by examiner

METHOD FOR FILTERING POLISHING ADDITIVE-CONTAINING LIQUID, POLISHING ADDITIVE-CONTAINING LIQUID, POLISHING COMPOSITION, METHOD FOR PRODUCING POLISHING COMPOSITION, AND FILTER

TECHNICAL FIELD

The present invention relates to a method for filtering an additive-containing liquid. More specifically, the invention relates to a filtration method of a liquid containing an additive (polishing additive) to be contained and used in a polishing composition. The present application claims priority based on Japanese Patent Application No. 2019-146778 filed on 8 Aug. 2019, the entire contents of which are incorporated herein by reference.

BACKGROUND ART

Precision polishing has been performed using polishing compositions on surfaces of material such as metals, metalloids, non-metals, and their oxides, or the like. The polishing composition or component of the polishing composition is used for polishing generally after filtered with various types of filters to remove or reduce large particles or contaminants that may result in deteriorated surface smoothness. Examples of literature regarding this kind of related art include Patent Literatures 1 and 2.

CITATION LIST

Patent Literature

Patent Literature 1: Japanese Patent Application Publication No. 11-302633
Patent Literature 2: Japanese Patent Application Publication No. 2017-75316

SUMMARY OF INVENTION

Technical Problem

In recent years, higher quality surfaces have been required for semiconductor substrates such as silicon wafers and other substrates. There is a demand for suppression of defects at a level that would not be required conventionally. Thus, large particles and contaminants contained in polishing compositions are required to be removed or reduced with higher precision. In the technique described in Patent Literature 2, for example, filtration with a filter is performed on an abrasive-containing liquid. However, due to the trend toward the higher quality of substrates as described above, the filtration of only the abrasive or abrasive-containing liquid has not become insufficient.

Polishing compositions contain various kinds of additives (polishing additives), as well as the abrasives, from the viewpoint of improving different polishing performances. Large particles or contaminants derived from these various kinds of additives have the tendency of having a relatively small grain size, compared to an abrasive or large particles derived from the abrasive, which makes it difficult to remove the large particles and contaminants along with the abrasive having a comparatively large diameter at the same time. In order to remove the large particles and contaminants derived from the additive with high precision, it is effective to perform filtration of the additive or additive-containing liquid with a filter.

In such filtration of the additive-containing liquid, there may be a need for a filter with higher precision (specifically, which is configured to remove finer particles) than a filter used in filtration of the conventional polishing composition, because large particles derived from the additive have a relatively small diameter. However, the filtration using a high-precision filter generally tends to easily cause clogging of the filter, resulting in a reduced flow rate of filtration at a relatively early stage after the filtration is started. Therefore, it is difficult both to improve the removal precision of large particles and contaminants derived from an additive and to achieve a long lifetime, a low pressure loss, and a high flow rate of a filter in filtration of the additive-containing liquid.

The present invention has been made in view of the above circumstances, and its object is to provide a method for filtering a polishing additive-containing liquid that can achieve a polishing composition exhibiting an excellent defect reducing capability while maintaining a practical life (lifetime) of a filter, in filtration of the polishing additive-containing liquid. Another related object of the present invention is to provide a polishing additive-containing liquid that has been filtered by the above filtration method. A further related object of the present invention is to provide a polishing composition containing a polishing additive contained in the polishing additive-containing liquid filtered as described above. Still another related object of the present invention is to provide a method for producing a polishing composition. A still further related object of the present invention is to provide a filter suitable for use in filtration of the polishing additive-containing liquid.

Solution to Problem

The present invention relates to a method for filtering a liquid containing a polishing additive. The above filtration method includes the step of filtering the liquid with a filter, the filter having the following properties: an average pore diameter P, measured by a palm porometer, of 0.15 μm or less; and a pore diameter gradient ($S_{in}/S_{out}$) of 3 or less, which is a ratio of an inlet-side average pore diameter ($S_{in}$) to an outlet-side average pore diameter ($S_{out}$), the diameters being measured through observation with an SEM.

The filter with such properties can appropriately capture even large particles that have a relatively small grain size and are derived from the polishing additive because the average pore diameter P measured by the palm porometer is 0.15 μm or less. When the pore diameter gradient ($S_{in}/S_{out}$) of the filter is 3 or less, the filter is less likely to be clogged in the filtration, so that its life can be easily extended. Therefore, according to such a filtration method, large particles and contaminants derived from the polishing additive can be removed and reduced with high precision while maintaining the practical filter life in the filtration of the additive-containing liquid.

In a preferred embodiment of the art disclosed herein, the polishing composition contains a water-soluble polymer. In the liquid containing the water-soluble polymer, part of the water-soluble polymer may exist in the state of a low-soluble form, an aggregate, a high-molecular-weight form, or the like. Such a water-soluble polymer may cause large particles. According to the art described in the present specification, large particles derived from the above-described water-soluble polymer can be removed with high precision while maintaining a filter life. Thus, it is meaningful to apply the art disclosed herein to an additive-containing liquid that contains a water-soluble polymer.

In a preferred embodiment of the art disclosed herein, the water-based polymer contains a cellulose derivative. In the liquid containing the cellulose derivative, part of the cellulose derivative may exist in the state of a low-soluble form, an aggregate, a high-molecular-weight form, or the like. Such a cellulose derivative may cause large particles. The art disclosed herein can be applied to a polishing additive-containing liquid that contains a cellulose derivative, thereby making it possible to remove or reduce large particles derived from the additive while more favorably maintaining the filter life.

In a preferred embodiment of the art disclosed herein, the liquid contains water. In addition, at least part of the water-soluble polymer is dissolved in the water. The art of the present invention can be applied to a polishing additive-containing liquid that contains a water-soluble polymer and water and in which at least part of the water-soluble polymer is dissolved in the water, so that large particles derived from the additive can be removed or reduced while more favorably maintaining the filter life.

In a preferred embodiment of the art disclosed herein, the liquid contains substantially no abrasive. An abrasive or large particle derived from the abrasive tends to have a size greater than an additive except for the abrasive or large particle derived from the additive. Therefore, it is effective to filtrate the liquid in the form of not substantially containing any abrasive in order to conduct the high-precision filtration of an additive whose average size is smaller than that of the abrasive. The filtration method disclosed herein is used in an additive-containing liquid that contains substantially no abrasive, so that large particles derived from the additive having a relatively small diameter in the additive-containing liquid can be captured with high precision and removed from the liquid while preventing clogging of the filter.

In a preferred embodiment of the art disclosed herein, the liquid is a filtrate subjected to at least one pre-filtration. According to such a filtration method, filtration is conducted by using a specific filter on the polishing additive-containing liquid from which large particles that may cause clogging of the filter have been removed to some extent by pre-filtration, which makes it easier to improve the filter life.

As described in the present specification, the polishing additive-containing liquid that has been filtered by any one of the methods disclosed herein is provided. Such a polishing additive-containing liquid can be a liquid from which large particles and contaminants derived from the additive can be removed or reduced with high precision. The polishing additive-containing liquid tends to improve a defect reducing capability because the polishing additive contained in the polishing additive-containing liquid is contained and used in the polishing composition.

As described in the present specification, the polishing composition that contains the polishing additive contained in the polishing additive-containing liquid filtered by the filter is provided, wherein the filter has the following properties: an average pore diameter P, measured by a palm porometer, of 0.15 μm or less; and a pore diameter gradient $(S_{in}/S_{out})$ of 3 or less, which is a ratio of an inlet-side average pore diameter $(S_{in})$ to an outlet-side average pore diameter $(S_{out})$, the diameters being measured through observation with an SEM. The polishing additive contained in the polishing additive-containing liquid can be one from which large particles and contaminants derived from the additive are removed or reduced with high precision. The polishing composition containing the polishing additive from which large particles and the like are removed or reduced in this way tend to have a more excellent defect reducing capability.

As described in the present specification, a method for producing a polishing composition is provided. The above filtration method is characterized by having the polishing additive in the polishing additive-containing liquid filtered by the filter, wherein the filter has the following properties: an average pore diameter P, measured by a palm porometer, of 0.15 μm or less; and a pore diameter gradient $(S_{in}/S_{out})$ of 3 or less, which is a ratio of an inlet-side average pore diameter $(S_{in})$ to an outlet-side average pore diameter $(S_{out})$, the diameters being measured through observation with an SEM. Through the filtration of the polishing additive-containing liquid with the filter having the above properties, large particles and contaminants which are derived from the additive and may deteriorate the defect reducing capability of the polishing composition can be removed or reduced with high precision. Therefore, according to the above method, the polishing composition with excellent defect reducing capability can be produced.

As described in the present specification, the filter suitable for use in filtration of a liquid containing a polishing additive is provided. The above filter has the following properties: an average pore diameter P, measured by a palm porometer, of 0.15 μm or less; and a pore diameter gradient $(S_{in}/S_{out})$ or less, which is a ratio of an inlet-side average pore diameter $(S_{in})$ to an outlet-side average pore diameter $(S_{out})$, the diameters being measured through observation with an SEM. When using such a filter for filtration of the liquid containing the polishing additive, large particles and contaminants contained in the polishing additive-containing liquid can be removed or reduced with high precision while maintaining the practical filter life. The above filter can provide the polishing composition with excellent defect reducing capability.

DESCRIPTION OF EMBODIMENTS

Preferred embodiments of the present invention will be described below. Incidentally, matters that are other than those particularly mentioned in the present specification but are necessary for implementation of the present invention can be recognized by those skilled in the art as design matters based on the prior art in the relevant field. The present invention can be implemented based on contents disclosed in the present specification and common general technical knowledge in the field.

<Filtration Method>
(Liquid to be Filtered)

In a filtration method disclosed herein, the object to be filtered is a liquid containing a polishing additive (hereinafter also simply referred to as "additive-containing liquid"). The polishing additive as used here in the present specification (hereinafter also simply referred to as "additive") refers to components other than an abrasive among all components contained and used in a polishing composition. However, the fact that the polishing additive is a component other than the abrasive does not exclude the additive itself having the function of mechanically polishing the object to be polished.

The polishing additive-containing liquid as used in the present specification, which is the above-described object to be filtered, is also referred to as a "liquid to be filtered" for convenience for the purpose of distinguishing it from a polishing additive-containing liquid which is a filtrate that has been subjected to filtration (hereinafter also referred to as an "additive-containing filtrate").

The additive is not particularly limited and may be selected and used from various kinds of additives which are usually used in the field of polishing compositions. Examples of the additive include water-soluble polymers, surfactants, basic compounds, water, chelating agents, organic acids, organic acid salts, inorganic acids, inorganic acid salts, antiseptic agents, antifungal agents, oxidants, etc. These additives can be used alone or in combination of two or more kinds.

(Water-Soluble Polymer)

The art disclosed herein can be preferably applied to a liquid to be filtered that contains a water-soluble polymer as the polishing additive. In the liquid to be filtered that contains water-soluble polymers, part of the water-soluble polymers may exist in the state of a low-soluble form, an aggregate, a high-molecular-weight form, or the like. These water-soluble polymers in the low-soluble form or the like are more likely to cause large particles. According to the art disclosed herein, large particles derived from the above-described water-soluble polymers can be removed with high precision while maintaining a practical filter life. Therefore, it is meaningful to apply the art disclosed herein to the liquid to be filtered that contains water-soluble polymers.

The kinds of water-soluble polymers are not particularly limited, and those having at least one functional group selected from cationic, anionic, and nonionic groups can be used. The water-soluble polymer may have a hydroxyl group, a carboxyl group, an acyl group, an acyloxy group, a sulfo group, an amide group, a quaternary ammonium structure, a heterocyclic structure, a vinyl structure, a poly-oxyalkylene structure, or the like.

Examples of the water-soluble polymer include: cellulose derivatives; starch derivatives; polymers containing oxyalkylene units such as a copolymer of ethylene oxide (EO) and propylene oxide (PO); a vinyl alcohol-based polymer such as polyvinyl alcohol (PVA); polymers containing nitrogen atoms such as a polymer containing an N-vinyl type monomer unit, imine derivatives, and a polymer containing an N-(meth)acryloyl type monomer unit; and the like. Among these, a vinyl alcohol-based polymer, cellulose derivatives, and a polymer containing an N-(meth)acryloyl type monomer unit are preferable, and cellulose derivatives are more preferable in that the application of the present invention becomes significantly meaningful due to the condition where large particles are easily generated and that the polishing performance can be improved when used in the polishing composition. These water-soluble polymers can be used alone or in combination of two or more kinds.

The cellulose derivative is a polymer containing a β-glu-cose unit as the main repeating unit. Specific examples of the cellulose derivative include hydroxyethyl cellulose (HEC), hydroxypropyl cellulose, hydroxyethyl methyl cellulose, hydroxypropyl methyl cellulose, methyl cellulose, ethyl cellulose, ethyl hydroxyethyl cellulose, carboxymethyl cellulose and the like. Among these, HEC is preferable.

The water-soluble polymer is not particularly limited, but both a polymer derived from a natural product and a polymer derived from a synthetic polymer can be used. The effects of the filtration method disclosed herein are easily achieved in polymers derived from natural products because of limitations on their purity and control of contaminants.

The weight average molecular weight (Mw) of the water-soluble polymer (for example, a cellulose derivative) is not particularly limited. The Mw of the water-soluble polymer is usually appropriately $0.4 \times 10^4$ or more, preferably $1 \times 10^4$ or more, and more preferably $10 \times 10^4$ or more, from the view-point of protection of a surface to be polished and improvement in the polishing performance. In a more preferred embodiment, the above-described Mw may be, for example, $15 \times 10^4$ or more, further $20 \times 10^4$ or more, or $25 \times 10^4$ or more. From the viewpoint of improvement of the filter life in the filtration of the liquid to be filtered, the Mw of the water-soluble polymer can be set to about $300 \times 10^4$ or less, and is appropriately $150 \times 10^4$ or less. The Mw may be, for example, $100 \times 10^4$ or less, $50 \times 10^4$ or less, or $40 \times 10^4$ or less.

In the present specification, a value based on gel perme-ation chromatography (GPC) (water-based, polyethylene oxide equivalent) can be adopted as the Mw of the water-soluble polymer. A model "HLC-8320GPC" manufactured by Tosoh Corporation may be used as a GPC measuring device. The measurement conditions may be as described below. The same method is also adopted in examples to be mentioned later.

[GPC Measurement Conditions]

Sample concentration: 0.1% by weight

Column: TSKgel GMPW$_{XL}$

Detector: differential refractometer

Eluent: 0.1 mol/L NaNO$_3$ aqueous solution

Flow velocity: 1.0 mL/min

Measurement temperature: 40° C.

Sample injection amount: 200 μL

The content of the water-soluble polymer in the liquid to be filtered (if the liquid to be filtered contains two or more water-soluble polymers, the total content of them) is not particularly limited. For example, the content of the water-soluble polymer in the liquid to be filtered can be 0.001% by weight or more, or also 0.01% by weight or more. From the viewpoint of filtration efficiency, the content of the water-soluble polymer in the liquid to be filtered is preferably 0.1% by weight or more, more preferably 0.5% by weight or more, and still more preferably 0.8% by weight or more (for example, 1.0% by weight or more). From the viewpoint of maintaining the filter life, the content of the water-soluble polymer in the liquid to be filtered is appropriately 30% by weight or less, preferably 10% by weight or less, more preferably 5% by weight or less, and still more preferably 3% by weight or less (for example, 1.5% by weight or less).

The liquid to be filtered as disclosed herein contains a surfactant in a preferred embodiment. The surfactant can contribute to improving the dispersion stability of a polish-ing slurry or its concentrate. The surfactant is not particu-larly limited, and any of an amphoteric surfactant, a cationic surfactant, an anionic surfactant and a nonionic surfactant can be used. Further, as the surfactant, for example, an organic compound having an Mw of less than 4000 can be used. From the viewpoint of filtration ability of the liquid to be filtered, the cleanability of the object to be polished, and the like, the Mw of the surfactant is preferably 3500 or less. Further, in a preferred embodiment of the art disclosed herein, the Mw of the surfactant is 100 or more, more preferably 200 or more, still more preferably 250 or more, and particularly preferably 300 or more. The polishing removal rate is easily improved by using the surfactant having the above Mw in the polishing composition.

As the Mw of the surfactant, a value determined by GPC (water-based, polyethylene glycol equivalent) can be adopted. The GPC measurement conditions of the Mw of the surfactant can be the same as those of the Mw of the water-soluble polymer. When the Mw cannot be measured under the above conditions, a value calculated from a chemical formula of the surfactant can be adopted as the Mw of the surfactant. The case where the Mw cannot be measured includes, for example, when the Mw of the surfactant is small.

Examples of the surfactant include nonionic surfactants, which include: oxyalkylene polymers such as polyethylene glycol, polypropylene glycol, and polytetramethylene glycol; polyoxyalkylene adducts such as polyoxyethylene alkyl ethers, polyoxyethylene alkyl phenyl ethers, polyoxyethylene alkyl amines, polyoxyethylene fatty acid esters, polyoxyethylene glyceryl ether fatty acid esters, polyoxyethylene sorbitan fatty acid esters, and polyoxyethylene polyoxypropylene glycol; and copolymers of multiple kinds of oxyalkylenes (diblock type, triblock type, random type, alternating type). As the above surfactant, a surfactant having a polyoxyalkylene structure is preferably used. These surfactants can be used alone or in combination of two or more kinds.

Specific examples of the nonionic surfactant having a polyoxyalkylene structure include block copolymers of ethylene oxide (EO) and propylene oxide (PO) (a diblock type copolymer, a PEO (polyethylene oxide)-PPO (polypropylene oxide)-PEO type triblock, a PPO-PEO-PPO type triblock copolymer, and the like), random copolymers of EO and PO, polyoxyethylene glycol, polyoxyethylene propyl ether, polyoxyethylene butyl ether, polyoxyethylene pentyl ether, polyoxyethylene hexyl ether, polyoxyethylene octyl ether, polyoxyethylene-2-ethylhexyl ether, polyoxyethylene nonyl ether, polyoxyethylene decyl ether, polyoxyethylene isodecyl ether, polyoxyethylene tridecyl ether, polyoxyethylene lauryl ether, polyoxyethylene cetyl ether, polyoxyethylene stearyl ether, polyoxyethylene isostearyl ether, polyoxyethylene oleyl ether, polyoxyethylene phenyl ether, polyoxyethylene octyl phenyl ether, polyoxyethylene nonyl phenyl ether, polyoxyethylene dodecyl phenyl ether, polyoxyethylene styrenated phenyl ether, polyoxyethylene lauryl amine, polyoxyethylene stearyl amine, polyoxyethylene oleyl amine, polyoxyethylene monolaurate, polyoxyethylene monostearate, polyoxyethylene distearate, polyoxyethylene monooleate, polyoxyethylene dioleate, polyoxyethylene sorbitan monolaurate, polyoxyethylene sorbitan monopalmitate, polyoxyethylene sorbitan monostearate, polyoxyethylene sorbitan monooleate, polyoxyethylene sorbitan trioleate, polyoxyethylene sorbit tetraoleate, polyoxyethylene castor oil, polyoxyethylene hydrogenated castor oil, and the like.

The content of the surfactant in the liquid to be filtered (if the liquid to be filtered contains two or more surfactants, the total content of them) is not particularly limited. For example, the content of the surfactant in the liquid to be filtered can be 0.0005% by weight or more, or also 0.001% by weight or more. The content of the surfactant in the liquid to be filtered is preferably 0.01% by weight or more, more preferably 0.05% by weight or more, and still more preferably 0.08% by weight or more (for example, 0.1% by weight or more). The content of the surfactant in the liquid to be filtered is appropriately 3% by weight or less, preferably 1% by weight or less, more preferably 0.5% by weight or less, and still more preferably 0.3% by weight or less (for example, 0.2% by weight or less).

(Water)

The liquid to be filtered as disclosed herein contains water in a preferred embodiment. As for water contained in the liquid to be filtered, ion-exchange water (deionized water), pure water, ultrapure water, distilled water, or the like can be preferably used. The water to be used preferably has a total content of transition metal ions of, for example, 100 ppb or less in order to avoid hindering the action of other components contained in the liquid to be filtered or polishing composition as much as possible. For example, the purity of water can be enhanced by an operation such as removal of impurity ions derived from an ion exchange resin, removal of contaminants of the filter, distillation, or the like.

The liquid to be filtered as disclosed herein contains the water-soluble polymer and water in a preferred embodiment, with at least part of the water-soluble polymer being dissolved in the water. When the art disclosed herein is applied to such a liquid to be filtered, large particles derived from the additive can be removed and reduced with high precision while maintaining the practical filter life.

(Basic Compound)

The liquid to be filtered as disclosed herein contains a basic compound in a preferred embodiment. As used in the present specification, the term "basic compound" refers to a compound having the function of dissolving in water and raising the pH of the aqueous solution. Using the basic compound easily improves the solubility of the water-soluble polymer in the liquid to be filtered. As the basic compound, an organic or inorganic basic compound containing nitrogen, an alkali metal hydroxide, an alkaline earth metal hydroxide, a quaternary phosphonium compound, various carbonates and hydrogen carbonates, and the like can be used. Examples of nitrogen-containing basic compounds include quaternary ammonium compounds, ammonia, amines (preferably water-soluble amines) and the like. Such basic compounds may be used alone or in combination of two or more kinds.

Among these basic compounds, for example, at least one kind of basic compound selected from the group consisting of alkali metal hydroxides, quaternary ammonium hydroxides, and ammonia can be preferably used. Among these, potassium hydroxide, tetraalkylammonium hydroxides (for example, tetramethylammonium hydroxide), and ammonia are more preferable, and ammonia is particularly preferable.

(Other Components)

In addition, the liquid to be filtered as disclosed herein may optionally contain a well-known additive that can be used in a polishing composition (typically, a polishing composition to be used in a polishing step of a silicon wafer), such as chelating agents, organic acids, organic acid salts, inorganic acids, inorganic acid salts, oxidants, antiseptic agents, and antifungal agents, as long as the effects of the present invention are not significantly impaired.

It is preferable that the liquid to be filtered as disclosed herein contains substantially no abrasive. An abrasive or large particle derived from the abrasive tends to have a grain size greater than an additive except for the abrasive or large particle derived from the additive. Thus, if the liquid to be filtered contains an abrasive, the filter is more likely to be clogged, and thereby the filter life tends to deteriorate. The state in which the liquid to be filtered contain substantially no abrasive refers to a state in which any abrasive is not blended at least intentionally in the liquid to be filtered. Specifically, this means that the content of the abrasive in the liquid to be filtered is 0.001% by weight or less (preferably 0.0001% by weight or less, and more preferably 0.00001% by weight or less). In a preferred embodiment, the content of the abrasive in the liquid to be filtered is 0% by weight.

<pH>

A pH of the liquid to be filtered as disclosed herein is not particularly limited. In order to improve the solubility of the water-soluble polymer, the pH of the liquid to be filtered is appropriately 7.0 or higher, and may be preferably 8.0 or higher, and more preferably 8.5 or higher, and may be 9.0 or higher. From the viewpoint of dispersion stability of the water-soluble polymer, the pH of the liquid to be filtered is preferably 12.0 or lower, more preferably 11.0 or lower, and still more preferably 10.5 or lower, and may be, for example, 10.0 or lower.

The pH of the liquid to be filtered can be grasped by performing three-point calibration using a standard buffer solution (a phthalate pH buffer solution, pH: 4.01 (at 25° C.), a neutral phosphate pH buffer solution, pH: 6.86 (at 25° C.), and a carbonate pH buffer solution, pH: 10.01 (at 25° C.)) by utilizing a pH meter (for example, a glass electrode type hydrogen ion concentration indicator manufactured by Horiba Ltd. (model number F-23)), then placing a glass electrode in the composition to be measured, and measuring a pH value after 2 minutes or longer have lapsed and the composition has been stabilized.

(Filter)

In the filtration method disclosed herein, the liquid to be filtered is filtered with a filter. The filter satisfies the following conditions (1) and (2).

(1) The average pore diameter P measured by a palm porometer is 0.15 μm or less.

(2) The pore diameter gradient ($S_{in}/S_{out}$), which is the ratio of the inlet-side average pore diameter $S_{in}$ to the outlet-side average pore diameter $S_{out}$, both diameters being measured through observation with an SEM, is 3 or less.

The average pore diameter P of the filter as used herein adopts a value of a pore diameter D50 that corresponds to a cumulative percentage of 50% in the fine pore diameter distribution which has been obtained by measurement based on a half dry method in conformity with the ASTM E1294-89. For example, the average pore diameter P can be measured using a palm porometer (CFP-1200AXL) manufactured by PMI Ltd. The above measurement method is also adopted in examples to be mentioned later.

The measurement method of the pore diameter gradient ($S_{in}/S_{out}$) is as follows. First, the inlet-side average pore diameter $S_{in}$ of the filter is measured by observing a filter surface on its side (the primary side) where the liquid to be filtered enters with an electron scanning microscope (SEM) and then analyzing an obtained image of the planar view of the surface by using image analysis software. Similarly, the outlet-side average pore diameter $S_{out}$ of the filter is measured by observing a filter surface on its side (the secondary side) where the filtered liquid exits with the SEM and then analyzing an obtained image of the planar view of the surface by using the image analysis software. The pore diameter gradient ($S_{in}/S_{out}$) of the filter is calculated as the ratio of the inlet-side average pore diameter $S_{in}$ to the outlet-side average pore diameter $S_{out}$. As the SEM, SU8000 series SEM, manufactured by Hitachi High-Technologies Corporation, or its equivalent is used. As the image analysis software, Mac-View, manufactured by MOUNTECH Co., Ltd., or its equivalent can be used. The above measurement method is also adopted in the examples described below.

By using a filter in which the average pore diameter P measured by the palm porometer is 0.15 μm or less, even large particles derived from the additive, which tend to have a grain size smaller than that of other particles such as large particles derived from the abrasive, can be captured with high precision and removed from the liquid to be filtered. Further, the filter that has the pore diameter gradient ($S_{in}/S_{out}$) of 3 or less is less likely to be clogged in the filtration, so that its life can be easily extended. Therefore, when filtering the liquid to be filtered using such a filter, large particles and contaminants derived from the additive are easily removed and reduced with high precision while maintaining the practical filter life.

The reason why the filter with the pore diameter gradient ($S_{in}/S_{out}$) of 3 or less achieves a favorable filter life is not interpreted in a limiting way, but may include the following, for example. That is, a filter having a relatively small pore diameter gradient ($S_{in}/S_{out}$) has a larger area with fine pores that are effective in capturing large particles derived from the additive, compared to a filter having a relatively large pore diameter gradient ($S_{in}/S_{out}$). Thus, by using the filter having a small pore diameter gradient ($S_{in}/S_{out}$) of about 3 or less, more large particles can be captured before the filter becomes blocked (clogged). As a result, such a filter is used for filtration of the liquid to be filtered, which can achieve the favorable filter life.

In the art disclosed herein, the filter in which an average pore diameter P measured by a palm porometer is 0.15 μm or less is selectively used, thereby making it possible to achieve the efficient removal of contaminants from the liquid to be filtered. In a preferred embodiment, the average pore diameter P of the filter may be 0.14 μm or less, more preferably 0.13 μm or less, and still more preferably 0.12 μm or less especially because the filter can efficiently remove contaminants from the liquid to be filtered. In addition, by selectively using a filter having a pore diameter gradient ($S_{in}/S_{out}$) of 3 or less from among the filters having the above average pore diameter, a long life, a low pressure drop, and a high flow rate can be achieved, while achieving high-precision filtration for large particles or the like. In particular, it is preferable to selectively use a filter with a pore diameter gradient ($S_{in}/S_{out}$) of 2.5 or less and more preferably 2 or less because a long filter life can be achieved.

The filter structure is not particularly limited as long as the filter satisfies the above conditions (1) and (2). In a preferred embodiment of the art disclosed herein, the above filter is a membrane filter that includes a layer composed of a porous membrane. In another preferred embodiment, the filter includes a filter fiber layer composed of filter fibers. An example of the filter including the filter fiber layer is a woven filter (mesh filter).

The material of the membrane filter is not particularly limited. Examples of the material of the membrane filter include polyesters such as polyethylene terephthalate, polyolefins such as polyethylene (PE) and polypropylene (PP), polyamides such as nylon, fluororesins such as polytetrafluoroethylene (PTFE) and polyvinylidene fluoride (PVDF), cellulose-based polymers such as cellulose, cellulose acetate, and cellulose mixed ester, polyimides, polysulfone (PSF), polyethersulfone (PES), and the like. From the viewpoint of easily satisfying the conditions (1) and (2) regarding the above average pore diameter P and pore diameter gradient, polyethersulfone, polysulfone, and nylon are preferable, and polyethersulfone and polysulfone are more preferable.

The filter may or may not include a support body. A filter not including a support body tends to have an excellent filtering property. The support body may be the filter fiber layer described above.

When the filter includes the filter fiber layer, the material of the filter fiber is not particularly limited. Inorganic fibers such as a glass fiber (GF) and a carbon fiber, as well as organic fibers such as polymer fiber can be used. The inorganic fiber (preferably GF) impregnated with resin may be used. As the polymer fiber, for example, a fiber composed of one or more kinds of polyolefins such as polyethylene (PE) and polypropylene (PP), polyamides such as nylon, polyesters such as polyethylene terephthalate, fluororesins such as polytetrafluoroethylene (PTFE), polycarbonate, polyethersulfone, acrylic resins, polystyrene, polyurethane, cellulose, and cellulose acetate may be used. As the filter fiber, for example, a polyolefin fiber, a polyamide fiber, a polyester fiber and a fluororesin fiber may be used, or a polypropylene fiber may be used, in consideration of resistance to strong acids and strong alkali and the like. One or more kinds of inorganic fibers, such as GF, and one or more kinds of organic fibers such as polyolefin fibers, polyamide fibers, and polyester fibers, may be used in combination.

The filter fibers (and even the filter fiber layer or filter itself) disclosed herein may be cationized. By the cationization, the filter fibers (and even the filter fiber layer or filter itself) may have a positive zeta potential. The cationization method is not particularly limited, but examples thereof include a method where a cationic substance (cationic polyamide) having a cationic group such as an amine (primary amine, secondary amine, tertiary amine) or a quaternary ammonium is added (for example, impregnated) to the filter fibers. The cationized filter fibers may hold the cationic substance described above therein.

The medium shape of the filter disclosed herein is not particularly limited, and filters with various structures, shapes, and functions can be adopted as appropriate. Specific examples of the filter include a depth filter, a surface filter, a depth pleated filter formed by pleating a depth filter, a pleated filter formed by pleating a surface filter, and the like. Among these, the pleated filter is preferable from the viewpoint of improvement in the filtering property of the liquid to be filtered.

The entire structure of filter elements included in the filter disclosed herein is not particularly limited. The filter element can be, for example, substantially cylindrical. Such a filter element can be of a cartridge type that can be replaced on a regular basis. The above filter elements can include other members such as a core, in addition to a filter medium, but they do not characterize the present invention and thus they are not particularly described herein.

(Filtration)

The liquid to be filtered (the additive-containing liquid) disclosed herein is filtered with the filter disclosed herein. The art disclosed herein typically includes an operation of filtering the liquid to be filtered with a filter. The filtration conditions (for example, filtration pressure difference, filtration rate, and filtration amount) can be set as appropriate based on common technical knowledge in this field in consideration of the aiming quality and productivity, etc. The filtration disclosed herein can be preferably implemented on a condition of, for example, a filtration pressure difference of 0.8 MPa or less (e.g., 0.5 MPa or less, typically 0.3 MPa or less). The filtration method is not particularly limited, but can be appropriately selected from among, for example, natural filtration performed at normal pressure as well as known filtration methods such as suction filtration, pressure filtration, centrifugal filtration and the like.

In the filtration with the filter disclosed herein, the filtration rate (flow velocity) is not particularly limited. When using a disk filter with a diameter of 47 mm, for example, the flow velocity is appropriately 1.0 g/min or more, and is preferably 1.2 g/min or more, more preferably 1.5 g/min or more, and still more preferably 2.0 g/min or more from the viewpoint of productivity and the like.

The filtration amount in the filtration with the filter disclosed herein is not particularly limited. For example, when using a disk filter with a diameter of 47 mm, the filtration amount is appropriately 25 g or more, and from the viewpoint of productivity and the like, it is preferably 50 g or more, more preferably 100 g or more, and still more preferably 120 g or more.

In the art disclosed herein, before and after the filtration, supplemental filtration may be optionally carried out in a preliminary or multi-step manner, depending on the purpose such as large particle removal or high-precision filtration. For example, the supplemental filtration may be performed before the filtration disclosed herein. The supplemental filtration may be conducted with a filter whose removal rating is equivalent to the filter used in the filtration disclosed herein or with a filter with a larger removal rating than the filter used in the filtration disclosed herein. Alternatively, the supplemental filtration may be performed after the filtration disclosed herein. The supplemental filtration may be conducted with a filter whose removal rating is equivalent to the filter used in the filtration disclosed herein or with a filter with a smaller removal rating than the filter used in the filtration disclosed herein. In a preferable embodiment, before the filtration disclosed herein, at least one pre-filtration may be conducted for the purpose of removing contaminants such as large particles. In this case, the filtration disclosed herein may be one step in multi-step filtration.

The pre-filtration may be conducted, for example, as the first-step filtration with a filter whose removal rating is 0.05 μm or more and less than 1 μm (preferably 0.1 μm or more and 0.5 μm or less, and more preferably 0.15 μm or more and 0.25 μm or less), and as the second-step filtration with a filter whose removal rating is 0.01 μm or more and 0.5 μm or less (preferably 0.03 μm or more and 0.1 μm or less, and more preferably more than 0.04 μm and 0.06 μm or less). Alternatively, the pre-filtration may include a combination of either the above first-step filtration or the above second-step filtration and another pre-filtration. As the removal rating, the rated value by the manufacturer may be adopted. The same goes for examples to be mentioned later.

The filtration in the art disclosed herein is preferably filtration conducted immediately before mixing the additive into the abrasive-containing liquid. That is, the filtration in the art disclosed herein is preferably the filtration in the final step of the multi-step filtration of the additive-containing liquid. The filtered filtrate is stored in a container until it is mixed with the abrasive-containing liquid. The filtrate can be part B of a multiple-pack type polishing composition to be mentioned later.

(Mixing)

As described in the present specification, there is provided a method for producing a polishing composition which uses the additive-containing liquid (additive-containing filtrate) that has been filtered by any of the filtration methods disclosed herein. The method for producing the polishing composition can include, for example, a step of mixing a component to be contained in the polishing composition. Typically, the polishing composition can be produced by mixing the respective components, which are to be contained in the polishing composition, using a known mixer such as a propeller mixer, an ultrasonic disperser, a homomixer or the like. The embodiment of mixing these components is not particularly limited. For example, all components can be mixed at once or in a suitably selected order.

<Polishing Composition>

The art disclosed herein provides the polishing composition that contains the additive which is contained in the additive-containing filtrate obtained by the filtration using any one of the filtration methods disclosed herein. The polishing composition in the art disclosed herein is not particularly limited except that it contains the above additive. The polishing composition may further contain other components (for example, an abrasive) which are not contained in the above additive-containing filtrate.

(Abrasive)

The polishing composition disclosed herein contains an abrasive in a preferred embodiment. The abrasive serves to mechanically polish the surface of an object to be polished. The material and properties of the abrasive are not particularly limited, and can be selected as appropriate according to the purpose, usage, or the like of the polishing composition. Examples of the abrasive include inorganic particles, organic particles, and organic-inorganic composite particles. Specific examples of the inorganic particles include oxide particles such as silica particles, alumina particles, cerium oxide particles, chromium oxide particles, titanium dioxide particles, zirconium oxide particles, magnesium oxide particles, manganese dioxide particles, zinc oxide particles, and colcothar particles; nitride particles such as silicon nitride particles and boron nitride particles; carbide particles such as silicon carbide particles and boron carbide particles; diamond particles; and carbonates such as calcium carbonate and barium carbonate. Specific examples of the organic particles include polymethyl methacrylate (PMMA) particles, poly(meth)acrylic acid particles (where (meth)acrylic acid comprehensively refers to acrylic acid and methacrylic acid), and polyacrylonitrile particles. These abrasives may be used alone or in combination of two or more kinds.

As the above abrasive, inorganic particles are preferable. Among these, particles formed of an oxide of a metal or metalloid are preferable, and silica particles are particularly preferable. The adoption of silica particles as the abrasive is particularly meaningful in the polishing composition usable for polishing (for example, finish polishing) of an object to be polished with a surface made of silicon, such as a silicon wafer to be mentioned later. The art disclosed herein can be preferably implemented in an embodiment in which the abrasive is substantially composed of silica particles, for example. The term "substantially" here means that 95% by weight or more (preferably 98% by weight or more, more preferably 99% by weight or more, or 100% by weight) of particles constituting the abrasive are silica particles.

Specific examples of silica particles include a colloidal silica, fumed silica, precipitated silica and the like. These silica particles can be used alone or in combination of two or more kinds. The use of colloidal silica is particularly preferable because it can easily provide a polished surface with excellent surface quality after polishing. For example, colloidal silica prepared by an ion exchange method using water glass (Na silicate) as a raw material and alkoxide method colloidal silica (colloidal silica produced by a hydrolytic condensation reaction of an alkoxysilane) can be preferably adopted as the colloidal silica. Colloidal silica may be used alone or in combination of two or more kinds.

The BET diameter of the abrasive (typically, silica particles) is not particularly limited, but is preferably 5 nm or more, and more preferably 10 nm or more from the viewpoint of polishing removal rate and the like. From the viewpoint of obtaining a higher polishing effect (for example, effects such as haze reduction and defect removal), the BET diameter is preferably 15 nm or more, and more preferably 20 nm or more (for example, more than 20 nm). Further, from the viewpoint of preventing scratches and the like, the BET diameter of the abrasive is preferably 100 nm or less, more preferably 50 nm or less, and still more preferably 40 nm or less. The art disclosed herein is preferably applied to polishing in which a high-quality surface is required after polishing because a high-quality surface (for example, a surface having a small number of LPDs) can be easily obtained. As the abrasive to be used in such a polishing composition, an abrasive having a BET diameter of 35 nm or less (typically less than 35 nm, more preferably 32 nm or less, for example, less than 30 nm) is preferable.

The BET diameter as used in the present specification refers to the particle diameter calculated by the formula of BET diameter $(nm)=6000/(true\ density\ (g/cm^3) \times BET\ value\ (m^2/g))$ from the specific surface area (BET value) measured by the BET method. For example, in the case of silica particles, the BET diameter can be calculated from BET diameter $(nm)=2727/BET\ value\ (m^2/g)$. The specific surface area can be measured, for example, by using a surface area measuring device "Flow Sorb II 2300" (trade name), manufactured by Micromeritex Co., Ltd.

(Water-Soluble Polymer)

The polishing composition disclosed herein contains a water-soluble polymer in a preferred embodiment. When a water-soluble polymer is contained in the additive-containing filtrate, which is used to produce the polishing composition, the polishing composition may contain, as the water-soluble polymer, only this water-soluble polymer contained in the additive-containing filtrate. Alternatively, the polishing composition may further contain other water-soluble polymers, in addition to the above water-soluble polymer contained in the additive-containing filtrate. One or more of the kinds of water-soluble polymers listed above as water-soluble polymers used in the liquid to be filtered can be used alone or in combination as the water-soluble polymer suitable for use in the polishing composition disclosed herein. The specific description of the water-soluble polymer used in the polishing composition is omitted because it would be redundant.

(Surfactant)

The polishing composition disclosed herein contains a surfactant in a preferred embodiment. When a surfactant is contained in the additive-containing filtrate, which is used to produce the polishing composition, the polishing composition may contain, as the surfactant, only this surfactant contained in the additive-containing filtrate. Alternatively, the polishing composition may further contain other surfactants, in addition to the above surfactant contained in the additive-containing filtrate. One or more of the kinds of surfactants listed above as the surfactant used in the liquid to be filtered can be used alone or in combination as the surfactant suitable for use in the polishing composition disclosed herein. The specific description of the surfactant used in the polishing composition is omitted because it would be redundant.

(Water)

The polishing composition disclosed herein contains water in a preferred embodiment. The same type of water as those described as being used in the liquid to be filtered can be used suitably as the water to be contained in the polishing composition disclosed herein.

(Basic Compound)

The polishing composition disclosed herein contains a basic compound in a preferred embodiment. When a basic compound is contained in the additive-containing filtrate, which is used to produce the polishing composition, the polishing composition may contain, as the basic compound, only this basic compound contained in the additive-containing filtrate. Alternatively, the polishing composition may further contain other basic compounds, in addition to the above basic compound contained in the additive-containing filtrate. One or more of the kinds of basic compounds listed above as the basic compound used in the liquid to be filtered can be used alone or in combination as the basic compound suitable for use in the polishing composition disclosed herein. The specific description of the basic compound used in the polishing composition is omitted because it would be redundant.

<Other Components>

In addition, the polishing composition disclosed herein may further optionally contain a well-known additive that can be used in a polishing slurry (typically, a polishing slurry to be used in a polishing step of a silicon wafer), such as chelating agents, organic acids, organic acid salts, inorganic acids, inorganic acid salts, antiseptic agents, and antifungal agents, as long as the effects of the present invention are not significantly impaired.

It is preferable that the polishing composition disclosed herein contains substantially no oxidant. When the polishing composition contains an oxidant, the supply of the composition oxidizes the surface of a substrate (for example, a silicon substrate) to form an oxide layer, which can decrease a polishing removal rate. Here, the polishing composition containing substantially no oxidant means that the oxidant is not blended at least intentionally, and a trace amount of the oxidant that is inevitably contained due to raw materials, manufacturing method and the like is allowed to be present. The trace amount means that the molar concentration of the oxidant in the polishing composition is 0.0005 mol/L or less (preferably 0.0001 mon or less, more preferably 0.00001 mol/L or less, and particularly preferably 0.000001 mol/L or less). The polishing composition according to a preferred embodiment does not contain an oxidant. The polishing composition disclosed herein can be preferably implemented in an embodiment where it does not contain, for example, any of hydrogen peroxide, sodium persulfate, ammonium persulfate and sodium dichloroisocyanurate.

<pH>

The pH of the polishing composition disclosed herein is typically 8.0 or higher, preferably 8.5 or higher, more preferably 9.0 or higher, and still more preferably 9.3 or higher, for example 9.5 or higher. When the pH of the polishing composition is increased, the polishing removal rate tends to be improved. Meanwhile, from the viewpoint of preventing the dissolution of the abrasive (for example, silica particles) to suppress degrading of mechanical polishing effect, the pH of the polishing composition is suitably 12.0 or lower, preferably 11.0 or lower, more preferably 10.8 or lower, and still more preferably 10.5 or lower. The pH can be measured in the same way as a measurement method of the pH of the liquid to be filtered.

<Applications>

The polishing composition in the art disclosed herein can be applied to polishing of objects to be polished that are made of various materials and have various shapes. The material of the object to be polished can be, for example, a metal or metalloid such as silicon, aluminum, nickel, tungsten, copper, tantalum, titanium, and stainless steel and alloys thereof; a glassy substance such as quartz glass, aluminosilicate glass, and glassy carbon; a ceramic material such as alumina, silica, sapphire, silicon nitride, tantalum nitride, and titanium carbide; a compound semiconductor substrate material such as silicon carbide, gallium nitride, and gallium arsenide; a resin material such as polyimide resin; and the like. The object to be polished may be configured of a plurality of these materials.

The polishing composition in the art disclosed herein can be particularly preferably used for polishing a surface made of silicon (typically for polishing a silicon wafer). A typical example of the silicon wafer as used herein is a silicon single crystal wafer, for example, a silicon single crystal wafer obtained by slicing a silicon single crystal ingot.

The polishing composition disclosed herein can be preferably applied to a polishing step of an object to be polished (for example, a silicon wafer). The object to be polished may be subjected to general treatment, which can be applied to the object to be polished in a pre-process step upstream of the polishing step, such as lapping and etching, before the polishing step using the polishing composition disclosed herein.

The polishing composition disclosed herein can be preferably used, for example, in polishing an object to be polished (for example, a silicon wafer) which has been prepared in the pre-process so as to have the state of a surface roughness of 0.1 nm to 100 nm. The surface roughness Ra of the object to be polished can be measured using, for example, a laser scan type surface roughness meter "TMS-3000WRC" manufactured by Schmitt Measurement System Inc. The polishing composition disclosed herein can be effectively used in final polishing (finish polishing) or in polishing immediately therebefore and is particularly preferably used in final polishing. The final polishing as used herein refers to a final polishing step in the manufacturing process of a target product (that is, a process in which no further polishing is performed after this step).

The polishing composition disclosed herein is typically supplied to an object to be polished in the form of a polishing slurry containing the polishing composition, and it is used to polish the object. The polishing slurry can be prepared, for example, by diluting (typically by diluting with water) any of the polishing compositions disclosed herein. Alternatively, the polishing composition may be directly used as a polishing slurry as it is. That is, the concept of the polishing composition in the art disclosed herein is inclusive of both a polishing slurry (working slurry) which is supplied to the object to be polished and used for polishing the object to be polished, and a concentrate (that is, a stock solution of the polishing slurry) which is diluted and used as the polishing slurry. Another example of the polishing slurry containing the polishing composition disclosed herein is a polishing slurry obtained by adjusting the pH of the polishing composition.

(Polishing Slurry)

The content of the abrasive in the polishing slurry is not particularly limited, but is typically 0.01% by weight or more, preferably 0.05% by weight or more, and more preferably 0.10% by weight or more, for example 0.15% by weight or more. Higher polishing removal rates can be achieved by increasing the content of the abrasive. From the viewpoint of dispersion stability of particles in the polishing composition, the above content is appropriately 10% by weight or less, preferably 7% by weight or less, more preferably 5% by weight or less, and further preferably 2% by weight or less, for example, 1% by weight or less, and may be 0.7% by weight or less. In a preferred embodiment, the above content may be 0.5% by weight or less, or 0.2% by weight or less.

The concentration (total concentration) of the water-soluble polymer in the polishing slurry is not particularly limited, and can be, for example, 0.0001% by weight or more. From the viewpoint of haze reduction and the like, the preferable concentration of the water-soluble polymer is 0.0005% by weight or more, more preferably 0.001% by weight or more, for example 0.003% by weight or more, and may be 0.005% by weight or more. Further, from the viewpoint of polishing removal rate and the like, the concentration of the water-soluble polymer is preferably 0.2% by weight or less, more preferably 0.1% by weight or less, and may be 0.05% by weight or less (for example, 0.01% by weight or less).

The concentration of the basic compound in the polishing slurry is not particularly limited. From the viewpoint of improving the polishing removal rate and the like, the above concentration is preferably 0.001% by weight or more, and more preferably 0.003% by weight or more (for example, 0.004% by weight or more). Further, from the viewpoint of haze reduction and the like, the above concentration is appropriately less than 0.3% by weight, preferably less than 0.1% by weight, more preferably less than 0.05% by weight, and still more preferably less than 0.03% by weight (for example, less than 0.01% by weight).

(Concentrate)

The polishing composition disclosed herein may be in a concentrated form (that is, in the form of a polishing slurry concentrate which can also be regarded as the stock solution of the polishing slurry) before being supplied to an object to be polished. The polishing composition in such a concentrated form is advantageous from the viewpoint of convenience, cost reduction and the like in terms of production, distribution, storage and the like. The concentration rate is not particularly limited, but can be, for example, about 2 times to 100 times in terms of volume, and is usually appropriately set to about 5 times to 50 times (for example, about 10 times to 40 times).

Such a concentrate can be diluted at a desired timing to prepare a polishing slurry (working slurry) and used in an embodiment in which the polishing slurry is supplied to an object to be polished. The dilution can be performed, for example, by adding water to the concentrate and mixing them.

The content of the abrasive in the concentrate can be, for example, 50% by weight or less. From the viewpoint of handleability (for example, dispersion stability of the abrasive and filterability) of the concentrate and the like, the content of the abrasive in the concentrate is preferably 45% by weight or less, and more preferably 40% by weight or less. Further, from the viewpoint of convenience, cost reduction and the like in terms of production, distribution, storage and the like, the content of the abrasive can be, for example, 0.5% by weight or more, preferably 1% by weight or more, and more preferably 3% by weight or more.

(Preparation of Polishing Composition)

The polishing composition used in the art disclosed herein may be of a multi-agent type such as a two-agent type, in a preferred embodiment. For example, the polishing slurry may be configured to be prepared by mixing Part A containing at least the abrasive among the constituent components of the polishing composition and Part B containing at least part of the remaining components, and diluting them as necessary at appropriate timing. Part B can be the above-described additive-containing filtrate. Part A can be obtained through at least one filtration.

A method for preparing the polishing composition is not particularly limited. For example, the respective components constituting the polishing composition may be mixed using a well-known mixing device such as a blade type stirrer, an ultrasonic disperser, a homomixer or the like. The embodiment of mixing these components is not particularly limited. For example, all components can be mixed at once or in a suitably selected order. After the mixing, the mixture of the components may be subjected to at least one filtration, or may not be filtered at all.

<Polishing>

The polishing composition disclosed herein can be used for polishing an object to be polished, for example, in an embodiment including the following operations. Hereinafter, a preferred embodiment of a method for polishing an object to be polished (for example, a silicon wafer) using the polishing composition disclosed herein will be described.

That is, a polishing slurry containing any of the polishing compositions disclosed herein is prepared. Preparation of the polishing shiny may include preparation of a polishing slurry by performing operations such as concentration adjustment (for example, dilution), and pH adjustment on the polishing composition. Alternatively, the polishing composition may be directly used as the polishing slurry as it is.

Then, the polishing slurry is supplied to the object to be polished, and the object is polished by a general method. For example, when performing final polishing of a silicon wafer, typically, the silicon wafer that has been subjected to lapping is set in a general polishing machine, and the polishing slurry is supplied to the surface to be polished of the silicon wafer through a polishing pad of the polishing machine. Typically, the polishing pad is pressed against the surface to be polished of the silicon wafer and both the silicon wafer and the polishing pad are moved relative to each other (for example, rotationally moved) while the polishing slurry is continuously supplied. The polishing of the object to be polished is completed through such a polishing step.

The polishing pad used in the polishing step is not particularly limited. For example, a polishing pad of a polyurethane foam type, a non-woven fabric type, or a suede type can be used. Each polishing pad may or may not contain an abrasive. Usually, a polishing pad including no abrasive is preferably used.

The object polished using the polishing composition disclosed herein is typically cleaned. The cleaning can be performed using a suitable cleaning solution. The cleaning solution to be used is not particularly limited, and for example, an SC-1 cleaning solution (a mixed liquid of ammonium hydroxide ($NH_4OH$), hydrogen peroxide ($H_2O_2$) and water ($H_2O$)), an SC-2 cleaning solution (a mixed liquid of HCl, $H_2O_2$ and $H_2O$) or the like, which are common in the field of semiconductors and the like, can be used. The temperature of the cleaning solution can be, for example, in the range of room temperature (typically about 15° C. to 25° C.) or higher and up to about 90° C. From the viewpoint of improving the cleaning effect, a cleaning solution having a temperature of about 50° C. to 85° C. can be preferably used.

EXAMPLES

Several examples relating to the present invention will be described below, but the present invention is not intended to be limited to those indicated in the examples. Here, in the following description, "%" is on a weight basis unless otherwise specified.

Test Example 1: Filtration Test

[Preparation of Liquid to be Filtered]

HEC having a Mw of $28 \times 10^4$, water, and ammonia were mixed together to prepare a water-soluble polymer-containing liquid containing the HEC at a concentration of 1.012% and having a pH of about 9. The prepared water-soluble polymer-containing liquid was pre-filtered with a pre-filter having a removal rating of 0.05 μm, and the resulting filtrate was then used as the liquid to be filtered.

[Filtration Test]

The following filters having the average pore diameter P and pore diameter gradient ($S_{in}/S_{out}$) shown in Table 1 were prepared: FL1 (filter medium: PSF film, average pore diameter: 0.118 μm, pore diameter gradient: 1.99, filter diameter: 47 mm); FL2 (filter medium: PES film, average pore diameter: 0.145 μm, pore diameter gradient: 1.74, filter diameter: 47 mm); FL3 (filter medium: PES film, average pore diameter: 0.144 μm, pore diameter gradient: 4.25, filter diameter: 47 mm); and FL4 (filter medium: nylon film, average pore diameter: 0.418 μm, pore diameter gradient: 1.11, filter diameter: 47 mm). The liquid to be filtered that was prepared as described above was subjected to a filtration test using the respective filters FL1 to FL4. The above filtration test was conducted by a pressurized filtration method using a feed pump under the condition of a filtration pressure difference of 0.2 MPa or less. In the above filtration test, the filtration flow velocity at the end of the filtration of 120 g of the liquid to be filtered was recorded, and the filter life of each of the filters FL1 to FL4 was evaluated in the following two stages according to the magnitude of the filtration flow velocity. The evaluation results obtained about the filter life are shown in Table 1.

The filter in which the filtration flow velocity was 2.1 g/min or higher: Good (G)

The filter in which the filtration flow velocity was lower than 2.1 g/min, or the filter in which the filtration test was not able to continue due to the blocked filter before the filtration of 120 g of the liquid to be filtered was completed: Defective (P)

TABLE 1

| | Filter | | |
|---|---|---|---|
| Type | Average pore diameter P [um] | Pore diameter gradient ($S_{in}/S_{out}$) | Filtration evaluation Fiter life |
| FL1 | 0.118 | 1.99 | G |
| FL2 | 0.145 | 1.74 | G |
| FL3 | 0.144 | 4.25 | P |
| FL4 | 0.418 | 1.11 | G |

It is confirmed that the same filtration test was conducted using an additive-containing liquid obtained by adding polyoxyethylene polyoxypropylene glycol (Mw: 3100, average number of moles of oxyethylene added: 160) along with HEC, and the same results or tendencies in terms of the filter life were exhibited.

Test Example 2: Filtration Test

<Preparation of Polishing Composition>

Example 1

HEC, polyoxyethylene polyoxypropylene glycol, water, and ammonia were mixed together to prepare an additive-containing liquid containing the HEC at a concentration of 1.012% and polyoxyethylene polyoxypropylene glycol at a concentration of 0.149% and having a pH of about 9. The Mw of HEC was $28×10^4$. The Mw of the polyoxyethylene polyoxypropylene glycol was 3100, and the average number of moles of oxyethylene added thereof was 160. The above additive-containing liquid was pre-filtered with a pre-filter having the rated filtration accuracy of 0.05 μm, and then filtered with the filter FL1 A filtrate obtained in this way was used as an additive-containing filtrate for the preparation of the polishing composition according to Example 1.

Aside from this, an abrasive-containing liquid containing an abrasive, water, and ammonia was prepared. This abrasive-containing liquid was mixed with the additive-containing filtrate prepared as described above to thereby prepare a composition containing the abrasive at a concentration of 3.5%, ammonia at 0.10%, HEC at 0.17%, and polyoxyethylene polyoxypropylene glycol at 0.025%. The composition obtained was used as a polishing composition of Example 1. As the abrasive, a colloidal silica having a BET diameter of 25 nm was used. The BET diameter was measured using a surface area measuring device, product name "Flow Sorb II 2300", manufactured by Micromeritics Instrument Corp.

Examples 2 to 4

The additive-containing liquid was filtered in the same manner as Example 1 except that a filter shown in Table 2 was used instead of the filter FL1 to thereby prepare a polishing composition of each of Examples 2 to 4. It is noted that in Example 3 using the filter FL3, the filtration of a predetermined amount of additive-containing liquid was not able to be conducted due to the clogging of the filter FL3, and thus the polishing composition therefor was not prepared.

<Polishing of Silicon Wafer>

The contents of the stock polishing step applied to each example are described below.

(Stock Polishing Step)

A stock polishing composition containing 19% of an abrasive and 1.3% of a basic compound, with the balance being water, was prepared. Colloidal silica having a BET diameter of 35 nm was used as the abrasive. Potassium hydroxide (KOH) was used as the basic compound.

This stock polishing composition was diluted 20 times with water, and by using the resulting liquid as a polishing slurry (working slurry), a silicon wafer as an object to be polished was polished under the following stock polishing conditions. As the silicon wafer, a commercially available silicon single crystal wafer (conductivity type: P type, crystal orientation: <100>, resistivity: 1 Ω·cm or more and less than 100 Ω·cm, COP-free) having a diameter of 300 mm after lapping and etching was used.

[Stock Polishing Conditions]

Polishing machine: Single wafer polishing machine manufactured by Okamoto Machine Tool Works, Ltd., model "PNX-332B"

Polishing pressure: 20 kPa

Platen rotational speed: 20 rpm

Carrier rotational speed: 20 rpm

Polishing pad: manufactured by Fujibo Ehime Co., Ltd., product name "FP400"

Flow rate of polishing slurry: 1 L/min

Temperature of polishing slurry: 20° C.

Temperature of platen cooling water: 20° C.

Polishing time: 2.1 minutes (Final Polishing Step)

The polishing composition according to each of Examples was diluted 20 times with water, and by using the resulting liquid as a polishing slurry (working slurry), the silicon wafer obtained after the end of the above stock polishing step was polished under the following final polishing conditions.

(Final Polishing Conditions)

Polishing machine: Single wafer polishing machine manufactured by Okamoto

Machine Tool Works, Ltd., model "PNX-332B"

Polishing pressure: 15 kPa

Platen rotational speed: 30 rpm

Carrier rotational speed: 30 rpm

Polishing pad: manufactured by Fujibo Ehime Co., Ltd., product name "POLYPAS27NX"

Flow rate of polishing slurry: 2 L/min

Temperature of polishing slurry: 20° C.

Temperature of platen cooling water: 20° C.

Polishing time: 2.1 minutes

The polished silicon wafer was removed from the polishing machine and cleaned (SC-1 Cleaning) using a cleaning solution of $NH_4OH$ (29%):$H_2O_2$ (31%):deionized water (DIW)=2:5.4:20 (volume ratio). More specifically, a cleaning tank equipped with an ultrasonic oscillator with a frequency of 720 kHz was prepared, the cleaning solution was stored in the cleaning tank and held at 60° C., and the polished silicon wafer was immersed in the cleaning solution within the cleaning tank for 6 min and then rinsed with ultrapure water. After the step was repeated twice, the silicon wafer was dried.

[Defect Measurement (LPD-N)]

The number of light point defects, class N (LPD-Ns) present on the surface (polished surface) of the silicon wafer was measured using a wafer inspection device manufactured by KLA-Tencor corporation, product name "SURFSCAN SP2$^{XP}$", in a DCO mode of the device. The measured numbers of LPD-Ns are shown in Table 2.

[Defect Measurement (MAGICS)]

The number of defects present on the surface (polished surface) of the silicon wafer was measured using a wafer inspection device manufactured by Lasertec Corporation, product name "MAGICS M5350". The measured numbers of defects (MAGICS) are shown in Table 2.

TABLE 2

| | | Filter | | Polishing evaluation | |
|---|---|---|---|---|---|
| | Type | Average pore diameter P [um] | Pore diameter gradient ($S_{in}/S_{out}$) | Numfer of defects (LPD-N) | Number of defects (MAGICS) |
| Ex. 1 | FL1 | 0.118 | 1.99 | 22 | 107 |
| Ex. 2 | FL2 | 0.145 | 1.74 | 32 | 174 |
| Ex. 3 | FL3 | 0.144 | 4.25 | — | — |
| Ex. 4 | FL4 | 0.418 | 1.11 | 51 | 230 |

As can be clearly seen from the results of Table 1, the filters FL1, FL2, and FL4 having a pore diameter gradient ($S_{in}/S_{out}$) of 3 or less exhibited a favorable filter life when used for filtration of the HEC-containing liquid. On the other hand, the filter FL3 having a pore diameter gradient ($S_{in}/S_{out}$) greater than 3 was found to exhibit a deteriorated filter life when used for the filtration of the HEC-containing liquid.

Furthermore, as can be clearly seen from the results of Table 2, in the polishing compositions of Examples 1 and 2 prepared using the filters FL1 and FL2 so as to have an average pore diameter P, measured by the palm porometer, of 0.15 μm or less, and a pore diameter gradient ($S_{in}/S_{out}$) of 3 or less, both the numbers of defects, i.e., the number of LPD-N and the number of MAGICS, were significantly reduced, compared to the polishing composition of Example 4 prepared using the filter FL4 so as to have an average pore diameter P greater than 0.15 μm. These results show that the filtration with the filters FL1 and FL2 having an average pore diameter P of 0.15 μm or less and a pore diameter gradient ($S_{in}/S_{out}$) of 3 or less exhibited an excellent defect reducing capability by appropriately removing large particles and contaminants derived from the polishing additive, while maintaining the practical filter life.

While the specific examples of the present invention have been described above in detail, these are only examples, and do not limit the scope of the claims. The art recited in the claims include various modifications and alternations of the specific examples exemplified above.

The invention claimed is:

1. A method for filtering a liquid containing a polishing additive, the method comprising the step of:

filtering the liquid with a filter, wherein the filter has the following properties:

an average pore diameter P, measured by a palm porometer, of 0.15 μm or less; and a pore diameter gradient ($S_{in}/S_{out}$) of 1.11 or greater and 3 or less, wherein the pore diameter gradient is a ratio of an inlet-side average pore diameter ($S_{in}$) to an outlet-side average pore diameter ($S_{out}$), the diameters being measured through observation with an SEM;

wherein:

the liquid is a filtrate subjected to at least one pre-filtration; and a removal rating of a first-step filtration in the pre-filtration is from 0.05 μm to 0.25 μm.

2. The method according to claim 1, wherein the polishing additive contains a water-soluble polymer.

3. The method according to claim 2, wherein the water-based polymer contains a cellulose derivative.

4. The method according to claim 2, wherein the liquid contains water, and at least part of the water-soluble polymer is dissolved in the water.

5. The method according to claim 1, wherein the liquid contains substantially no abrasive.

6. The method of claim 1, wherein the pore diameter gradient ($S_{in}/S_{out}$) is 1.74 or greater and 3 or less.

7. A polishing additive-containing liquid that has been filtered by the method according to claim 1.

8. A polishing composition comprising:

a polishing additive contained in a polishing additive-containing liquid that has been filtered with a filter, wherein the filter has the following properties:

an average pore diameter P, measured by a palm porometer, of 0.15 μm or less; and a pore diameter gradient ($S_{in}/S_{out}$) of 1.11 or greater and 3 or less, wherein the pore diameter gradient is a ratio of an inlet-side average pore diameter ($S_{in}$) to an outlet-side average pore diameter ($S_{out}$), the diameters being measured through observation with an SEM;

wherein:

the polishing additive-containing liquid is obtained by filtering a liquid that has been subjected to at least one pre-filtration; and a removal rating of a first-step filtration in the pre-filtration is from 0.05 μm to 0.25 μm.

9. The polishing composition of claim 8, wherein the pore diameter gradient ($S_{in}/S_{out}$) is 1.74 or greater and 3 or less.

10. A method for producing a polishing composition, the method comprising the steps of:

filtering a liquid comprising a polishing additive with a filter to obtain a polishing additive-containing liquid; and mixing the obtained polishing additive-containing liquid with a liquid containing abrasive to prepare a polishing composition, wherein the filter has the following properties:

an average pore diameter P, measured by a palm porometer, of 0.15 µm or less; and a pore diameter gradient ($S_{in}/S_{out}$) of 1.11 or greater and 3 or less, wherein the pore diameter gradient is a ratio of an inlet-side average pore diameter ($S_{in}$) to an outlet-side average pore diameter ($S_{out}$), the diameters being measured through observation with an SEM;

wherein:

the liquid is a filtrate subjected to at least one pre-filtration; and a removal rating of a first-step filtration in the pre-filtration is from 0.05 µm to 0.25 µm.

11. The method of claim 10, wherein the pore diameter gradient ($S_{in}/S_{out}$) is 1.74 or greater and 3 or less.

12. A filter used for filtering a liquid containing a polishing additive, the filter having the following properties:

an average pore diameter P, measured by a palm porometer, of 0.15 µm or less; and a pore diameter gradient ($S_{in}/S_{out}$) of 1.11 or greater and 3 or less, wherein the pore diameter gradient is a ratio of an inlet-side average pore diameter ($S_{in}$) to an outlet-side average pore diameter ($S_{out}$), the diameters being measured through observation with an SEM; and wherein the filter is a pleated filter.

13. The filter of claim 12, wherein the pore diameter gradient ($S_{in}/S_{out}$) is 1.74 or greater and 3 or less.

14. A filter used for filtering a liquid containing a polishing additive, the filter having the following properties:

an average pore diameter P, measured by a palm porometer, of 0.15 µm or less; and a pore diameter gradient ($S_{in}/S_{out}$) of 3 or less, wherein the pore diameter gradient is a ratio of an inlet-side average pore diameter ($S_{in}$) to an outlet-side average pore diameter ($S_{out}$), the diameters being measured through observation with an SEM; and wherein:

the filter is a pleated filter; and the filter comprises polyethersulfone or polysulfone.

* * * * *